(12) United States Patent
Shibuya et al.

(10) Patent No.: US 12,046,542 B2
(45) Date of Patent: Jul. 23, 2024

(54) HEAT-DISSIPATING WIREBONDED MEMBERS ON PACKAGE SURFACES

(71) Applicant: TEXAS INSTRUMENTS INCORPORATED, Dallas, TX (US)

(72) Inventors: Makoto Shibuya, Beppu (JP); Makoto Yoshino, Beppu (JP); Kengo Aoya, Beppu (JP)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 11 days.

(21) Appl. No.: 17/246,056

(22) Filed: Apr. 30, 2021

(65) Prior Publication Data

US 2022/0352055 A1     Nov. 3, 2022

(51) Int. Cl.
*H01L 23/495*     (2006.01)
*H01L 21/48*     (2006.01)
*H01L 21/56*     (2006.01)
*H01L 23/31*     (2006.01)
*H01L 23/49*     (2006.01)

(52) U.S. Cl.
CPC .... *H01L 23/49568* (2013.01); *H01L 21/4825* (2013.01); *H01L 21/4885* (2013.01); *H01L 21/565* (2013.01); *H01L 23/3114* (2013.01); *H01L 23/49* (2013.01); *H01L 23/49506* (2013.01); *H01L 23/4952* (2013.01); *H01L 23/49582* (2013.01)

(58) Field of Classification Search
CPC ........... H01L 23/49568; H01L 21/4825; H01L 21/4885; H01L 21/565; H01L 23/3114; H01L 23/49; H01L 23/49506; H01L 23/4952; H01L 23/49582
See application file for complete search history.

(56) References Cited

U.S. PATENT DOCUMENTS

| | | | | |
|---|---|---|---|---|
| 4,935,803 A * | 6/1990 | Kalfus | ............. | H01L 23/49562 257/E23.044 |
| 6,331,731 B1 * | 12/2001 | Kelly | .................. | H01L 23/3677 257/E23.105 |
| 6,429,513 B1 * | 8/2002 | Shermer, IV | ......... | H01L 23/427 257/E23.092 |
| 7,619,303 B2 * | 11/2009 | Bayan | ............... | H01L 23/49541 257/E23.045 |

(Continued)

*Primary Examiner* — Eugene Lee
(74) *Attorney, Agent, or Firm* — Dawn Jos; Frank D. Cimino

(57) ABSTRACT

In some examples, a semiconductor package includes a semiconductor die having a device side and a non-device side opposing the device side. The device side has a circuit formed therein. The package includes a first conductive member having a first surface coupled to the non-device side of the semiconductor die and a second surface opposing the first surface. The second surface is exposed to a top surface of the semiconductor package. The package includes a second conductive member exposed to an exterior of the semiconductor package and coupled to the device side of the semiconductor die. The package includes a plurality of wirebonded members coupled to the second surface of the first conductive member and exposed to the exterior of the semiconductor package. At least one of the wirebonded members in the plurality of wirebonded members has a gauge of at least 5 mils.

15 Claims, 11 Drawing Sheets

(56) References Cited

U.S. PATENT DOCUMENTS

| | | | | |
|---|---|---|---|---|
| 8,094,455 B2* | 1/2012 | Hong-Chi | ............ | H01R 12/716 |
| | | | | 361/719 |
| 8,247,891 B2* | 8/2012 | Wen | ................. | H01L 23/49531 |
| | | | | 257/796 |
| 9,659,836 B2* | 5/2017 | Sakita | ................... | C23C 16/403 |
| 10,756,005 B2* | 8/2020 | Ziglioli | ............. | H01L 23/49548 |
| 2003/0051868 A1* | 3/2003 | Dishongh | ................ | F28D 15/00 |
| | | | | 165/185 |
| 2006/0156737 A1* | 7/2006 | Liu | ..................... | H01L 23/4334 |
| | | | | 257/E23.092 |
| 2006/0274512 A1* | 12/2006 | Brandenburg | ...... | H01L 23/3677 |
| | | | | 257/E23.101 |
| 2007/0267727 A1* | 11/2007 | Hu | .................... | H01L 23/49524 |
| | | | | 257/E23.044 |
| 2009/0053840 A1* | 2/2009 | Chou | ................... | H01L 25/167 |
| | | | | 257/E33.066 |
| 2009/0115037 A1* | 5/2009 | How | ................. | H01L 23/49548 |
| | | | | 438/122 |
| 2010/0052156 A1* | 3/2010 | Appelt | ............. | H01L 23/49816 |
| | | | | 257/E23.101 |
| 2010/0214754 A1* | 8/2010 | Luechinger | ........... | H01L 23/498 |
| | | | | 228/110.1 |
| 2013/0320517 A1* | 12/2013 | Shirley | ................. | B32B 37/12 |
| | | | | 165/185 |
| 2014/0179064 A1* | 6/2014 | Romig | ............. | H01L 23/49568 |
| | | | | 438/118 |
| 2016/0276246 A1* | 9/2016 | Yamaguchi | ......... | H01L 51/0048 |
| 2019/0006269 A1* | 1/2019 | Xu | ...................... | H01L 21/4825 |
| 2021/0305119 A1* | 9/2021 | Mallik | ................... | H01L 23/42 |

* cited by examiner

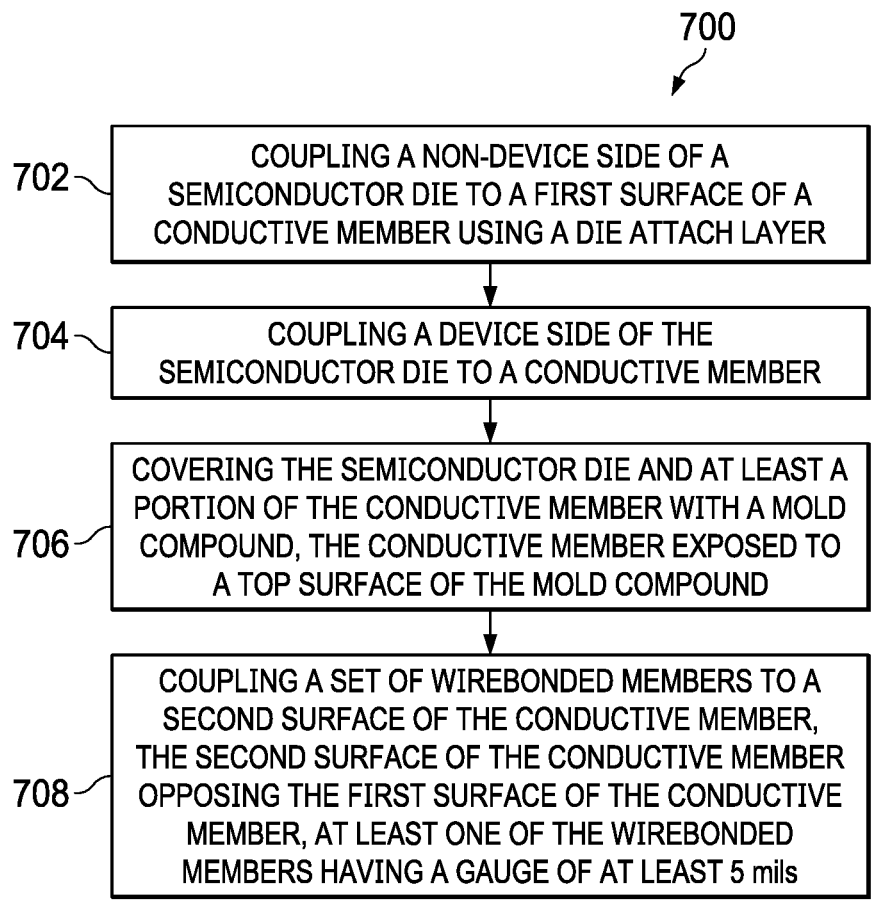
FIG. 7A
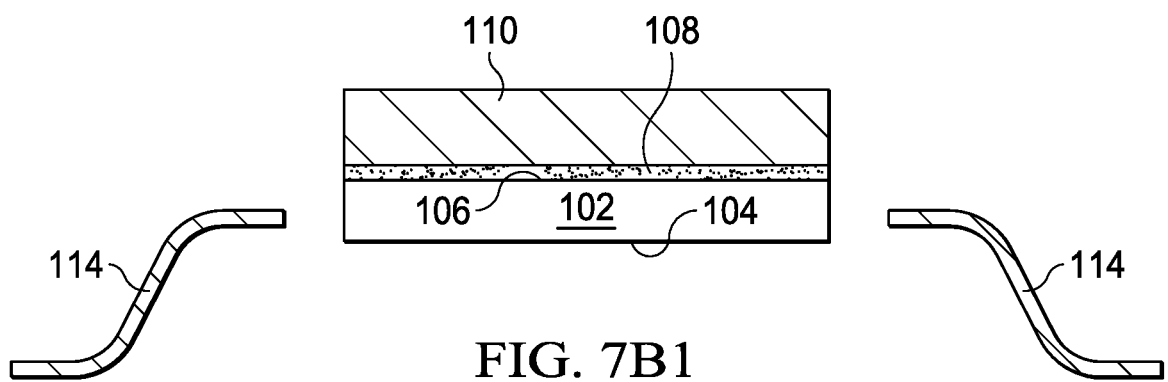
FIG. 7B1

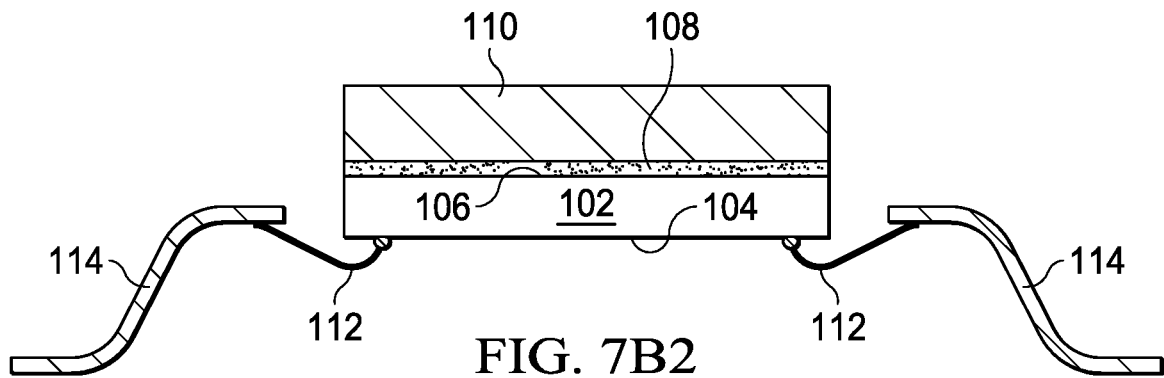
FIG. 7B2
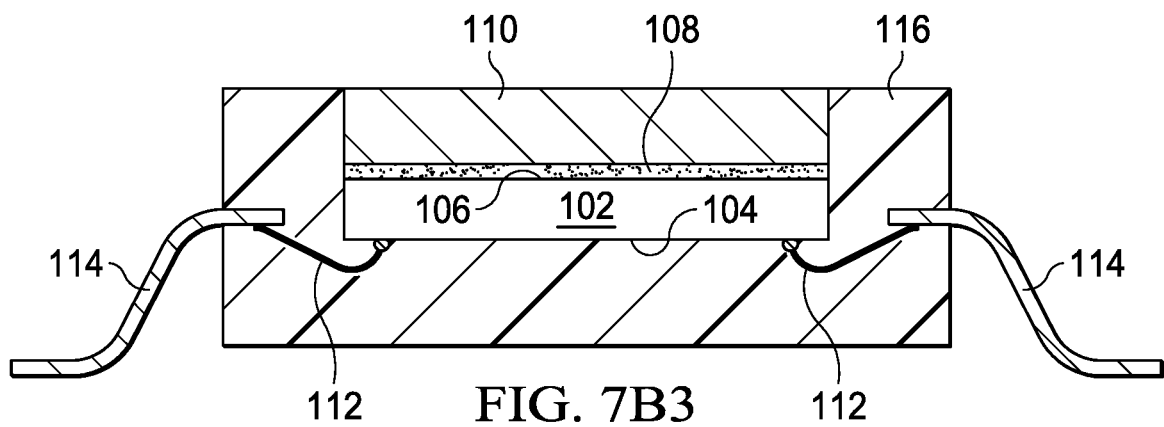
FIG. 7B3
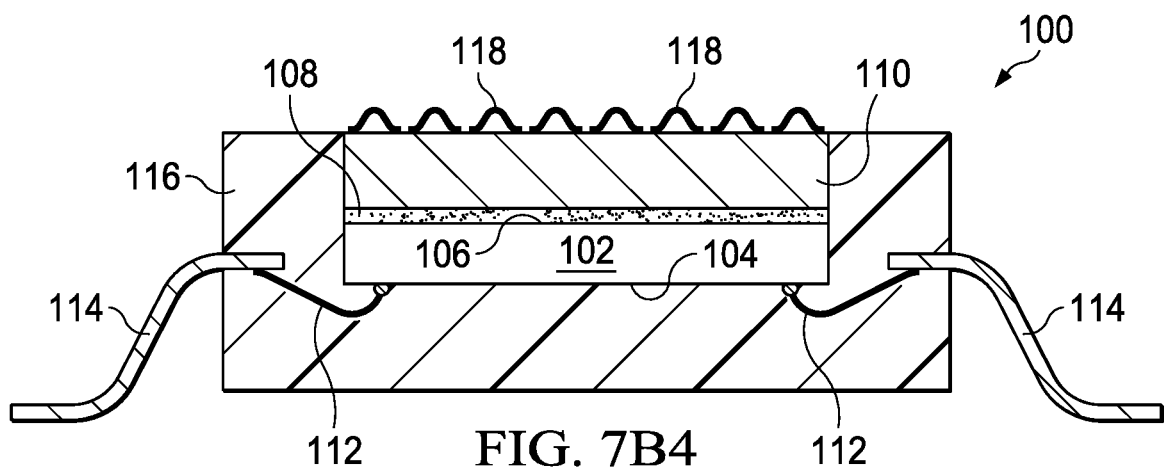
FIG. 7B4

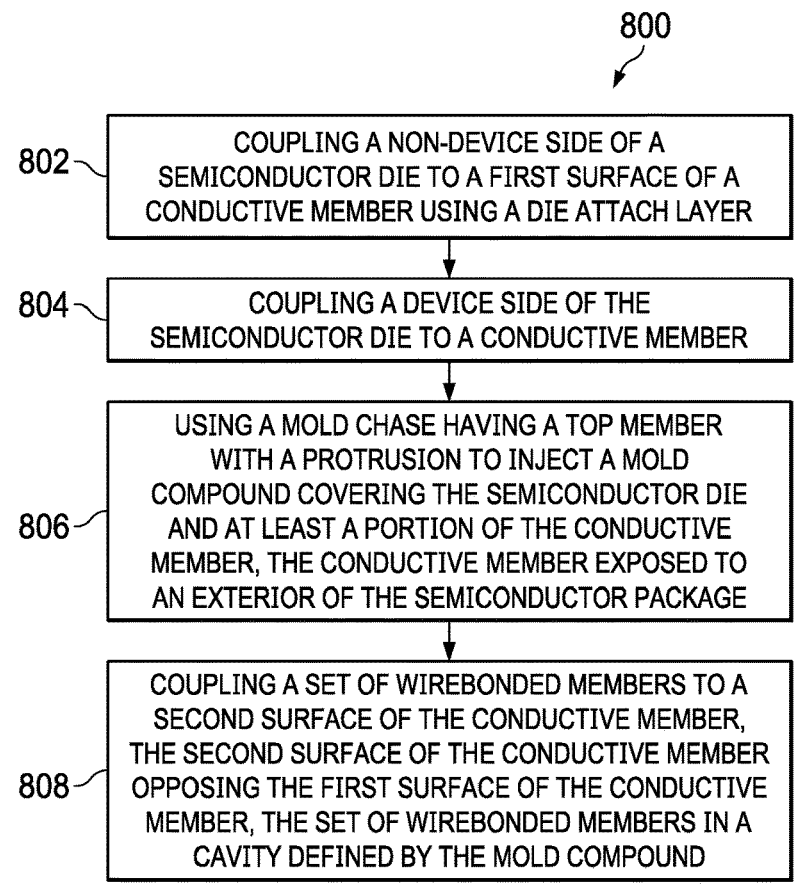
FIG. 8A
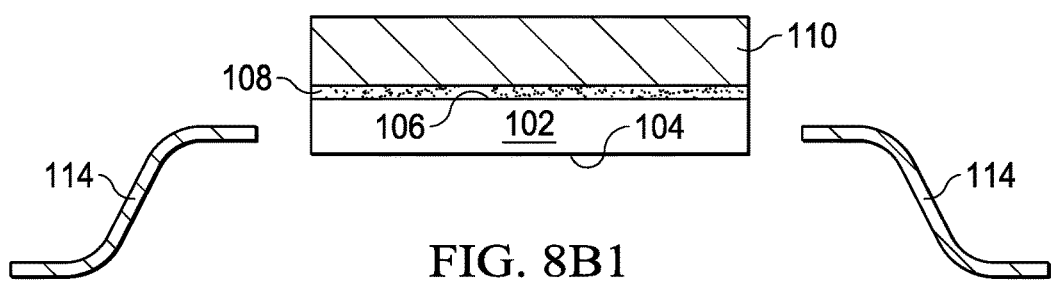
FIG. 8B1
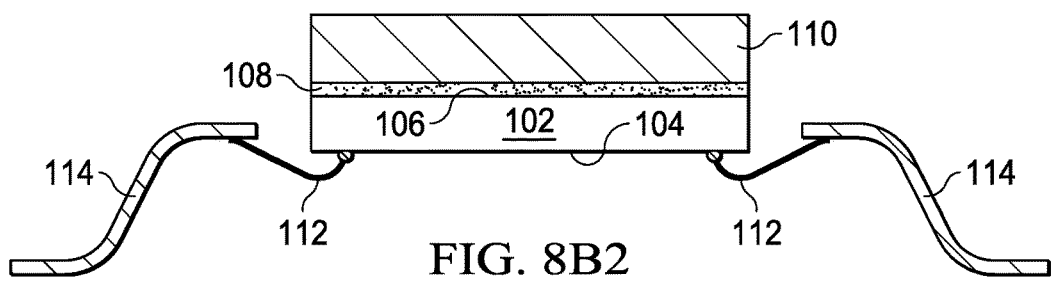
FIG. 8B2

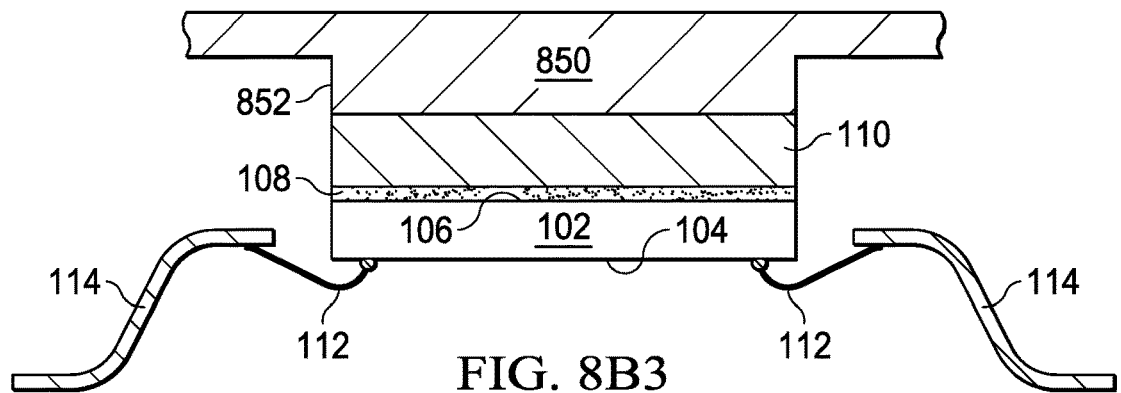
FIG. 8B3
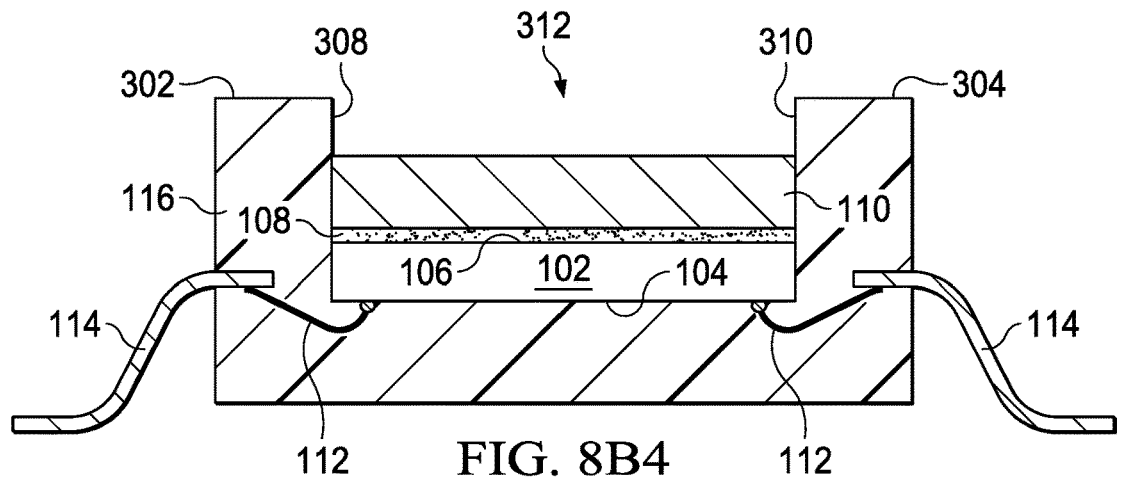
FIG. 8B4
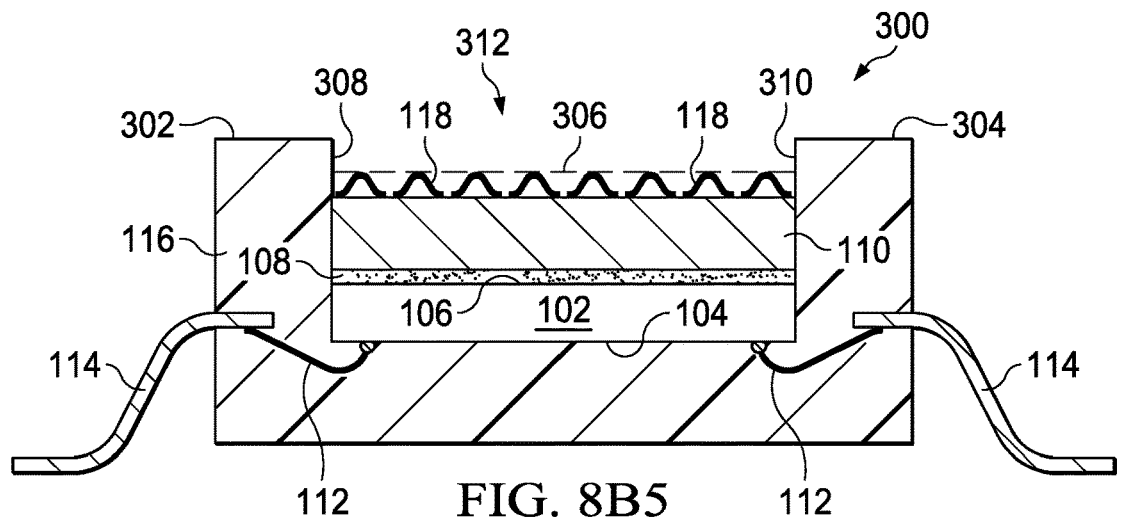
FIG. 8B5

HEAT-DISSIPATING WIREBONDED MEMBERS ON PACKAGE SURFACES

BACKGROUND

Semiconductor chips are housed inside packages that protect the chips from deleterious environmental influences, such as heat, moisture, and debris. A packaged chip communicates with electronic devices outside the package via conductive members (e.g., leads) that are exposed to surfaces of the package. Within the package, the chip may be electrically coupled to the conductive members using any suitable technique. One such technique is wire bonding, in which one end of a conductive wire (also called a bond wire) is coupled to a conductive member and the other end of the wire is coupled to the chip. Flip chip configurations are also useful, in which the semiconductor die is flipped upside down so the device side of the semiconductor die faces downward. In such configurations, the device side of the semiconductor die may be coupled to conductive members using solder bumps.

SUMMARY

In some examples, a semiconductor package includes a semiconductor die having a device side and a non-device side opposing the device side. The device side has a circuit formed therein. The package includes a first conductive member having a first surface coupled to the non-device side of the semiconductor die and a second surface opposing the first surface. The second surface is exposed to a top surface of the semiconductor package. The package includes a second conductive member exposed to an exterior of the semiconductor package and coupled to the device side of the semiconductor die. The package includes a plurality of wirebonded members coupled to the second surface of the first conductive member and exposed to the exterior of the semiconductor package. At least one of the wirebonded members in the plurality of wirebonded members has a gauge of at least 5 mils.

In some examples, a method includes coupling a non-device side of a semiconductor die to a first surface of a die pad using a die attach layer; coupling a device side of the semiconductor die to a conductive member; and covering the semiconductor die and at least a portion of the conductive member with a mold compound. The die pad is exposed to a top surface of the mold compound. The method also includes coupling a set of wirebonded members to a second surface of the die pad. The second surface of the die pad opposes the first surface of the die pad. At least one of the wirebonded members has a gauge of at least 5 mils.

BRIEF DESCRIPTION OF THE DRAWINGS

For a detailed description of various examples, reference will now be made to the accompanying drawings in which:

FIG. 7A is a flow diagram of a method for forming a semiconductor package having heat-dissipating wirebonded members, in accordance with various examples.

FIGS. 7B1-7B4 are a process flow for forming a semiconductor package having heat-dissipating wirebonded members, in accordance with various examples.

FIG. 8A is a flow diagram of a method for forming a semiconductor package having heat-dissipating wirebonded members in a cavity, in accordance with various examples.

FIGS. 8B1-8B5 are a process flow for forming a semiconductor package having heat-dissipating wirebonded members in a cavity, in accordance with various examples.

DETAILED DESCRIPTION

Semiconductor packages may generate heat. Depending on the application (e.g., power applications), semiconductor packages may generate substantial amounts of heat. Various technologies have been devised to help dissipate the heat from the package. If the heat is not dissipated, the package may be damaged or even rendered inoperable. Some packages include heat slugs and/or heat sinks that help dissipate heat, but heat slugs and heat sinks render packages expensive and bulky.

This description discloses various examples of a semiconductor package including a set of heat-dissipating wirebonded members on a top surface of the package. In some examples, the package has a conductive member, such as a die pad, that is exposed to a top surface of the semiconductor package. Wirebonded members are bonded to the outward-facing surface of the conductive member using wedge bonds, ribbon bonds, and/or ball bonds. In examples, the wirebonded members are formed of heavy-gauge bond wire (e.g., at least 5 mils). Because the wirebonded members are not covered by a mold compound and are exposed to the package environment, using a heavy-gauge bond wire to form the wirebonded members mitigates the risk of damage to the wirebonded members. Heat generated by a semiconductor die is provided to the conductive member by way of a die attach layer, and the heat subsequently is provided from the conductive member to the environment of the package by way of the wirebonded members.

The wirebonded members are significantly smaller and less expensive than other solutions. In some cases, wirebonded members may cost only 2-3% the expense of other solutions. The application of wirebonded members does not substantially change the semiconductor package manufacturing flow, as the wirebonded members may be coupled to the package after mold compound has been injected and the manufacturing process is generally complete. Further, because the wirebonded members may be composed of the same metal or metal alloy as the conductive member to which the wirebonded members are coupled, the wirebonded members are more firmly coupled to the conductive member relative to other solutions, and thermal resistance is also reduced relative to other solutions. Various examples are now described with reference to the drawings.

Figure 1A:
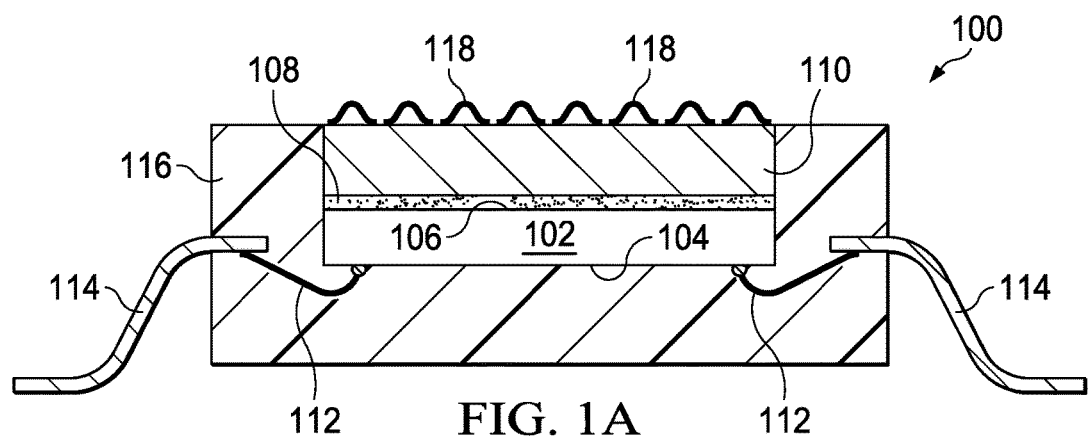
FIG. 1A is a profile cross-sectional view of a semiconductor package having a heat-dissipating wirebonded member, in accordance with various examples.

FIG. 1A is a profile cross-sectional view of a semiconductor package 100 having a heat-dissipating wirebonded member, in accordance with various examples. Notwithstanding the particular manner in which FIG. 1A depicts the semiconductor package 100, the semiconductor package 100 may be any suitable type of package, such as a dual inline package (DIP), a quad flat no-lead (QFN) package, a package having gullwing-style leads, a flip-chip style package, a combination of one or more such package types, etc. In FIG. 1A, the semiconductor package 100 is depicted as a wirebonded, gullwing lead style package having a flip-chip configuration. In particular, the semiconductor package 100 includes a semiconductor die 102 having a device side 104 and a non-device side 106. The device side 104 has circuitry formed therein. A die attach layer 108 (e.g., an epoxy, solder, or silver paste), is coupled to the non-device side 106, and the die attach layer 108 is coupled to a conductive member 110. In examples, the conductive member 110 is a die pad. In examples, the conductive member 110 is composed of copper, aluminum, or another suitable material. In examples, the top surface of the conductive member 110 is plated (e.g., using nickel palladium gold), and in other examples, the top surface of the conductive member 110 is not plated. In examples, the conductive member 110 is exposed to an exterior of the semiconductor package 100, meaning that the conductive member 110 is directly accessible from outside of the semiconductor package 100. In examples, the conductive member 110 is exposed to a surface (e.g., a top surface) of the semiconductor package 100, meaning that the conductive member 110 is directly accessible from outside of the semiconductor package 100 at that particular surface (e.g., at the top surface of the semiconductor package 100). Wirebonds 112 couple the device side 104 of the semiconductor die 102 to conductive members 114. The conductive members 114 are exposed to an exterior of the semiconductor package 100 and, in examples, are package leads. For instance, the conductive members 114 are gullwing-style leads. A mold compound 116 at least partially covers each of the components described above. A plurality of wirebonded members 118 is coupled to the conductive member 110 and is vertically aligned with the semiconductor die 102. Specifically, the plurality of wirebonded members 118 is coupled to a surface of the conductive member 110 that opposes the surface of the conductive member 110 to which the die attach layer 108 is coupled.

In examples, the wirebonded members 118 are wedge-bonded to the conductive member 110. In examples, the wirebonded members 118 are ball-bonded to the conductive member 110. In examples, the wirebonded members 118 are ribbon-bonded to the conductive member 110. In examples, a combination of bonding techniques are useful to couple the wirebonded members 118 to the conductive member 110 (e.g., a ball bond in combination with a wedge bond). In examples, other types of bonding techniques are useful to couple the wirebonded members 118 to the conductive member 110. In examples, and as shown, a segment of each wirebonded member 118 that is between the opposing ends of that wirebonded member 118 is suspended above the conductive member 110, for instance, in a loop or horseshoe shape. Other shapes for the wirebonded member 118 are contemplated and included in the scope of this disclosure.

In operation, heat generated by the semiconductor die 102 transfers to the conductive member 110 via the die attach layer 108. The heat is then expelled from the semiconductor package 100 via the wirebonded members 118. In examples, the wirebonded members 118 are not covered by the mold compound 116 and thus are not protected by the mold compound 116. However, to mitigate the risk of damage caused by influences external to the semiconductor package 100, such as mechanical impact by other objects, the wirebonded members 118 have a thick gauge (e.g., at least 5 mils). Thick gauge wirebonded members 118 may be coupled to the conductive member 110 using wedge bonds or ribbon bonds. Thinner gauge wirebonded members 118 (e.g., less than 5 mils) may be coupled to the conductive member 110 using ball bonds. The wirebonded members 118 may be of any suitable number, shape, size, and arrangement on the conductive member 110.

Figure 1B:
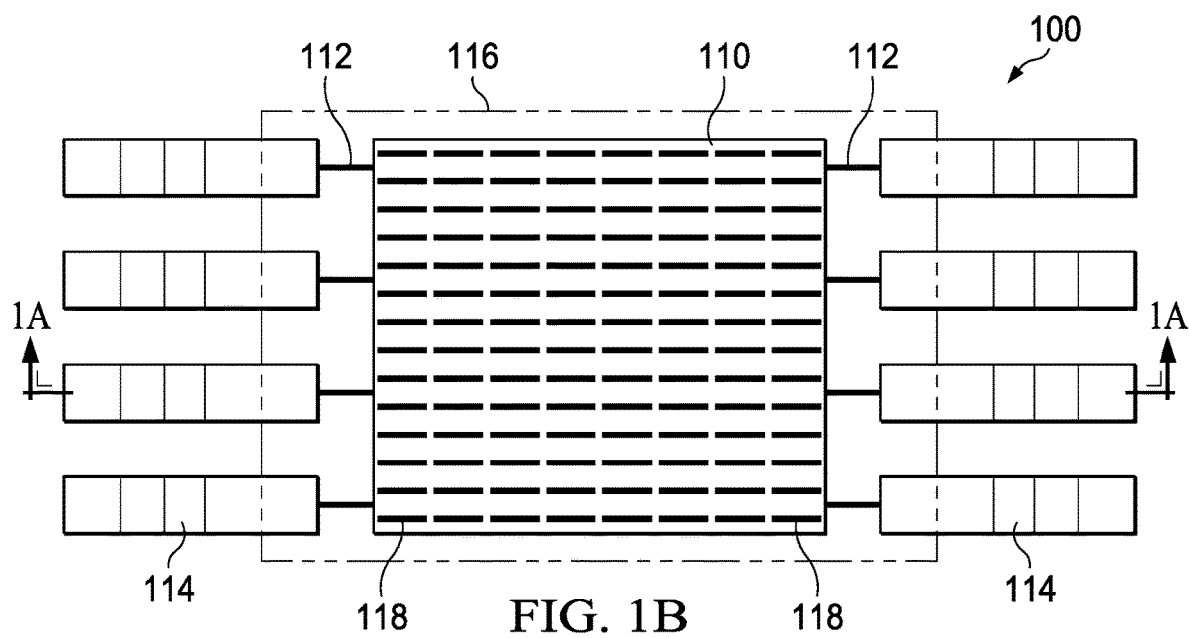
FIG. 1B is a top-down view of a semiconductor package having a heat-dissipating wirebonded member, in accordance with various examples.
Figure 1C:
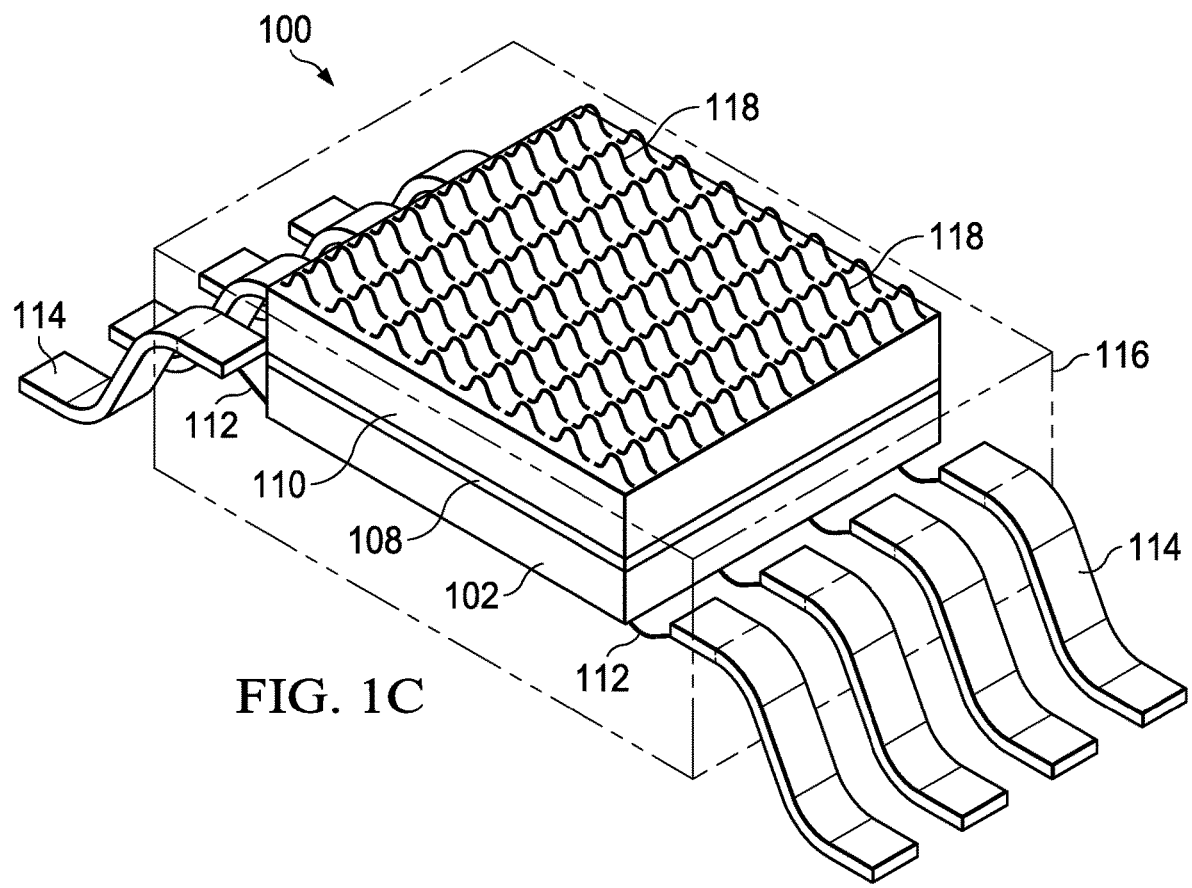
FIG. 1C is a perspective view of a semiconductor package having a heat-dissipating wirebonded member, in accordance with various examples.

FIG. 1B is a top-down view of the semiconductor package 100. FIG. 1C is a perspective view of the semiconductor package 100.

Figure 2A:
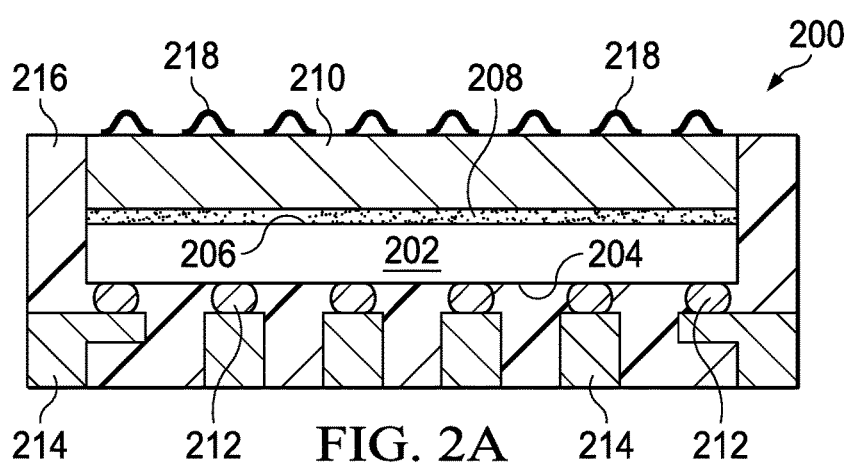
FIG. 2A is a profile cross-sectional view of a semiconductor package having a heat-dissipating wirebonded member, in accordance with various examples.

FIG. 2A is a profile cross-sectional view of a semiconductor package 200 having a heat-dissipating wirebonded member, in accordance with various examples. Notwithstanding the particular manner in which FIG. 2A depicts the semiconductor package 200, the semiconductor package 200 may be any suitable type of package, such as a dual inline package (DIP), a quad flat no-lead (QFN) package, a package having gullwing-style leads, a flip-chip style package, a combination of one or more such package types, etc. In FIG. 2A, the semiconductor package 200 is depicted as a QFN style package having a flip-chip configuration. Specifically, the semiconductor package 200 includes a semiconductor die 202 having a device side 204 and a non-device side 206. The device side 204 has circuitry formed therein. The semiconductor package 200 includes a die attach layer 208 that couples the semiconductor die 202 to a conductive member 210.

In examples, the conductive member 210 is composed of copper, aluminum, or another suitable material. In examples, the top surface of the conductive member 210 is plated (e.g., using nickel palladium gold), and in other examples, the top surface of the conductive member 210 is not plated. In examples, the conductive member 210 is exposed to an exterior of the semiconductor package 200, meaning that the conductive member 210 is directly accessible from outside of the semiconductor package 200. In examples, the conductive member 210 is exposed to a surface (e.g., a top surface) of the semiconductor package 200, meaning that the conductive member 210 is directly accessible from outside of the semiconductor package 200 at that particular surface (e.g., at the top surface of the semiconductor package 200). Balls 212 (e.g., solder balls) couple the device side 204 of the semiconductor die 202 to conductive members 214. The conductive members 214 are exposed to an exterior of the semiconductor package 200. A mold compound 216 at least partially covers each of the components described above. A plurality of wirebonded members 218 is coupled to the conductive member 210. Specifically, the plurality of wirebonded members 218 is coupled to a surface of the conductive member 210 that opposes the surface of the conductive member 210 to which the die attach layer 208 is coupled.

The description of the wirebonded members 118 also applies to the wirebonded members 218 and thus is not repeated here. The description of the operation of the semiconductor package 100 also applies to the semiconductor package 200 and thus is not repeated here.

Figure 2B:
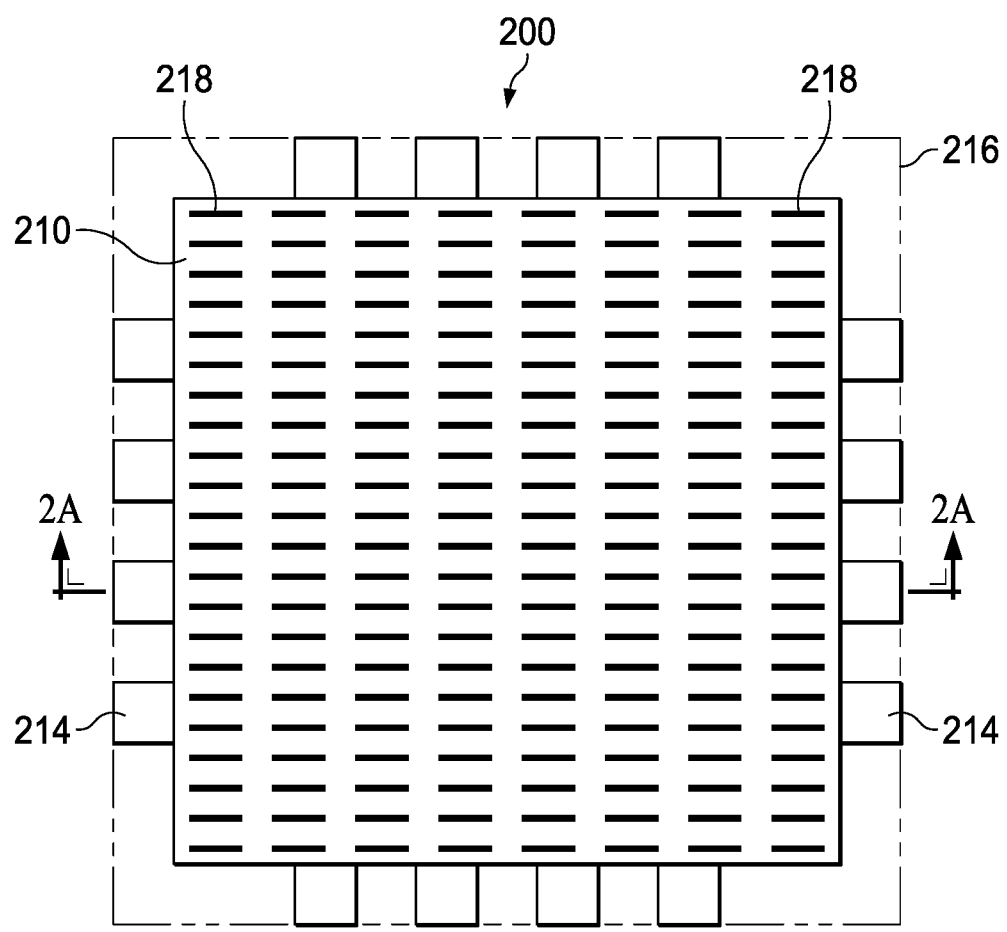
FIG. 2B is a top-down view of a semiconductor package having a heat-dissipating wirebonded member, in accordance with various examples.
Figure 2C:
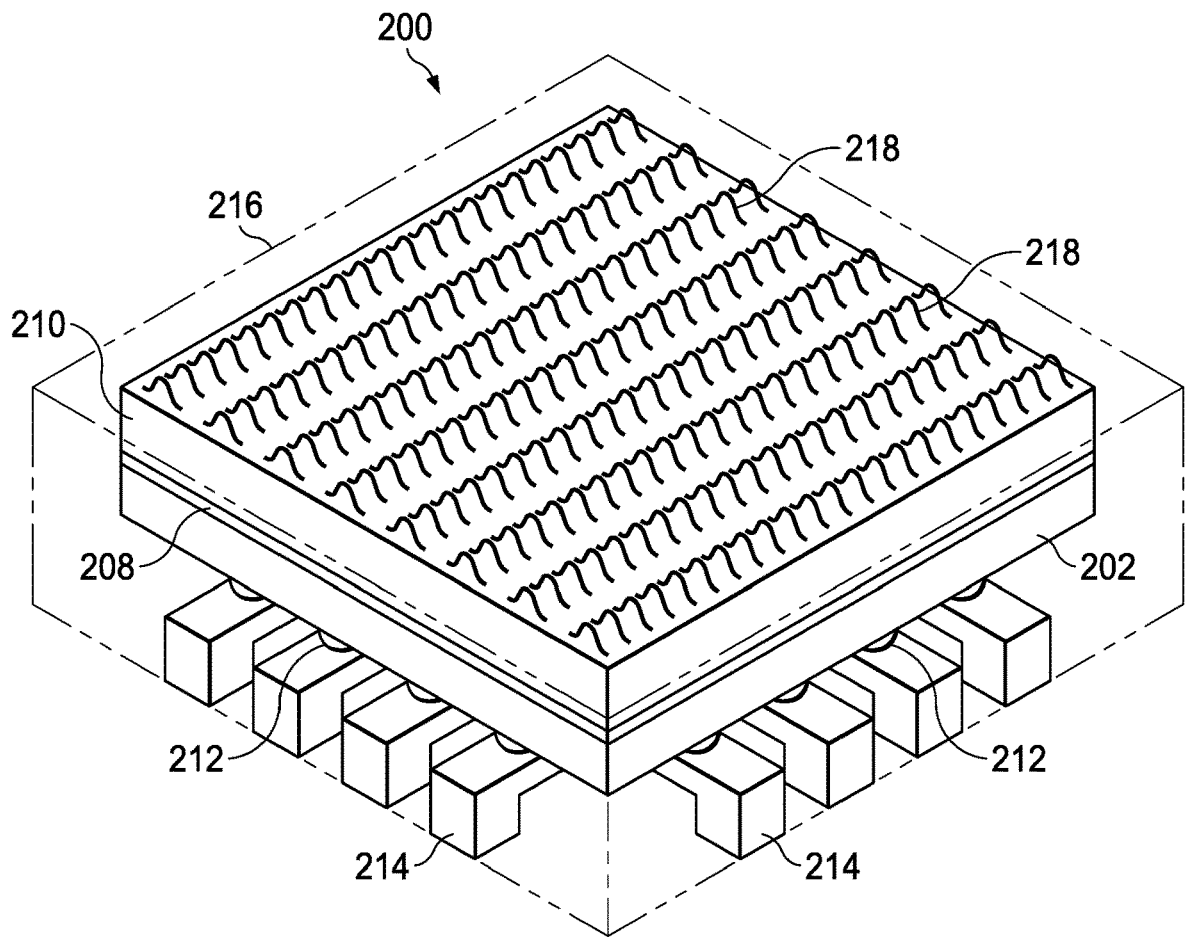
FIG. 2C is a perspective view of a semiconductor package having a heat-dissipating wirebonded member, in accordance with various examples.

FIG. 2B is a top-down view of the semiconductor package 200. FIG. 2C is a perspective view of the semiconductor package 200.

Figure 3A:
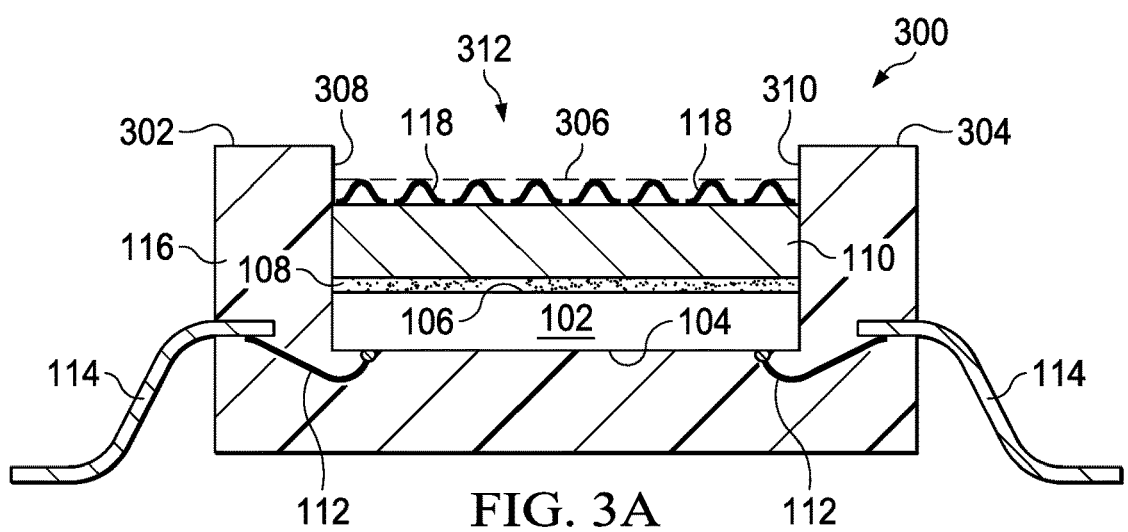
FIG. 3A is a profile cross-sectional view of a semiconductor package having a heat-dissipating wirebonded member, in accordance with various examples.

FIG. 3A is a profile cross-sectional view of a semiconductor package 300 having a heat-dissipating wirebonded member, in accordance with various examples. The semiconductor package 300 is virtually identical to the semiconductor package 100 described above. However, the semiconductor package 300 differs from the semiconductor package 100 in that the top surfaces 302, 304 of the mold compound 116 are not flush or approximately flush with the surface of the conductive member 110 to which the wirebonded members 118 are coupled. Rather, the top surfaces 302, 304 are raised higher than the surface of the conductive member 110 to which the wirebonded members 118 are coupled. For example, the top surfaces 302, 304 may be approximately level with the top surfaces of the wirebonded members 118 (indicated by a dashed line marked with numeral 306). In examples, the top surfaces 302, 304 may be higher than the top surfaces of the wirebonded members 118. In examples, the top surfaces 302, 304 may be higher than the surface of the conductive member 110 to which the wirebonded members 118 are coupled, but not as high as the top surfaces of the wirebonded members 118. By raising the top surfaces 302, 304 as described, the risk of mechanical damage (e.g., by blunt impact) to the wirebonded members 118 is reduced, because the wirebonded members 118 are protected to a degree by the pillars 308, 310 of the mold compound 116. A height of the surfaces 302, 304 that is too low relative to the line 306 makes the wirebonded members 118 more susceptible to damage, but will not adversely impact heat dissipation. Conversely, a height of the surfaces 302, 304 that is too high relative to the line 306 adversely impacts heat dissipation, but will protect the wirebonded members 118 from blunt impact. Accordingly, the heights of the surfaces 302, 304 are in a range from 400-1000 microns below the line 306 to 300-600 microns above the line 306. The existence of the line 306 in an example assumes that the wirebonded members 118 are of uniform height. However, in the event that the wirebonded members 118 are not of uniform height, the line 306 may represent the average height of the wirebonded members 118, or, alternatively, the line 306 may represent the tallest of the wirebonded members 118. The wirebonded members 118 may be said to be positioned inside a cavity 312 defined by the mold compound 116 and, more specifically, by the pillars 308, 310. Although the semiconductor package 300 is represented as a wirebonded package having gullwing-style leads and a flip-chip configuration, the package 300 may be of any suitable type.

Figure 3B:
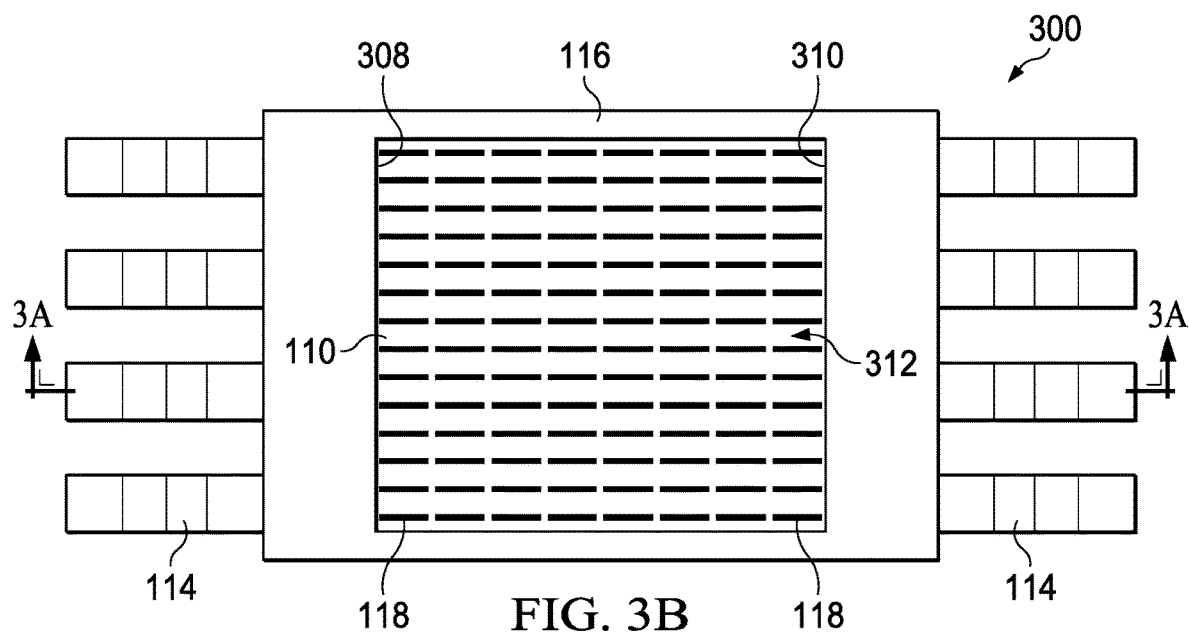
FIG. 3B is a top-down view of a semiconductor package having a heat-dissipating wirebonded member, in accordance with various examples.
Figure 3C:
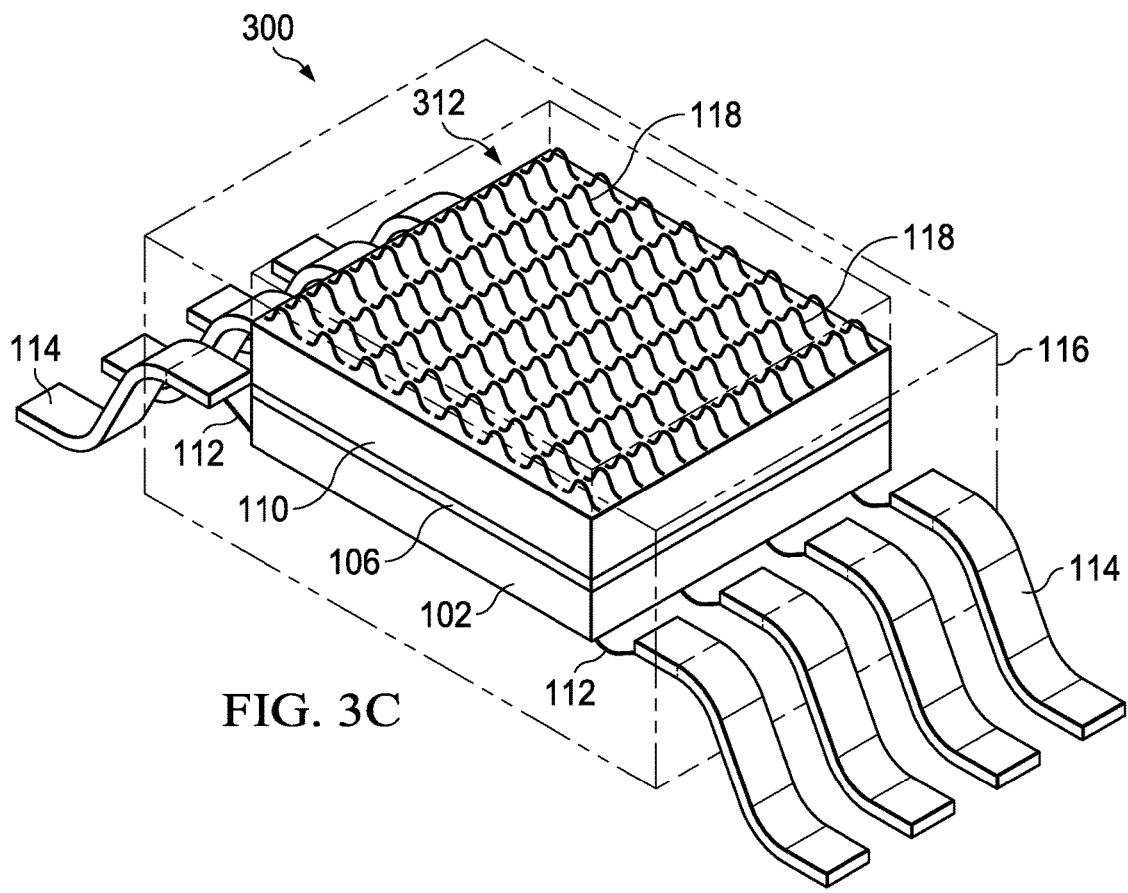
FIG. 3C is a perspective view of a semiconductor package having a heat-dissipating wirebonded member, in accordance with various examples.

FIG. 3B is a top-down view of the semiconductor package 300. FIG. 3C is a perspective view of the semiconductor package 300.

Figure 4A:
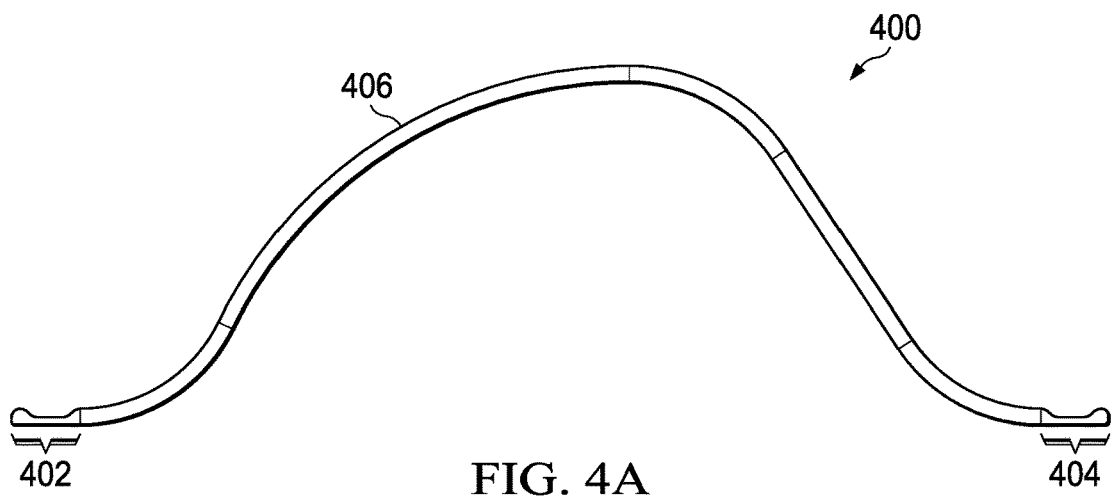
FIG. 4A is a profile view of a wirebonded member having a wedge bond, in accordance with various examples.

FIG. 4A is a profile view of a wirebonded member 400 having a wedge bond, in accordance with various examples. The wirebonded member 400 may be similar to the wirebonded members 118 described above. In some examples, the wirebonded member 400 is composed of copper, which has a thermal conductivity of approximately 398 watts per meter Kelvin. In some examples, the wirebonded member 400 is composed of aluminum, which has a lower thermal conductivity than copper, but is also less expensive than copper. In some examples, the wirebonded member 400 is composed of the same material (e.g., metal or metal alloy) as the conductive member (e.g., conductive member 110) to which it is coupled. As a result, the wirebonded member 400 is more firmly coupled to the conductive member relative to other solutions, and thermal resistance is also reduced relative to other solutions. As described above with reference to the wirebonded members 118, the wirebonded member 400 has a gauge of at least 5 mils. A gauge less than 5 mils does not adequately mitigate the risk of damage to the wirebonded member 400 as a result of physical impact with other objects. However, a gauge less than 5 mils may be used in the configuration of FIGS. 3A-3C, which includes a protective cavity 312. The wirebonded member 400 includes wedge bonds 402 and 404. The surface to which the wedge bonds 402 and 404 are coupled, such as the conductive member 110 of FIG. 1A, is not shown in FIG. 4A. In examples, a segment 406 that is between the opposing ends of the wirebonded member 400 at which the wedge bonds 402 and 404 are positioned is raised as shown, so the segment 406 does not contact the surface to which the wedge bonds 402 and 404 are coupled.

Figure 4B:
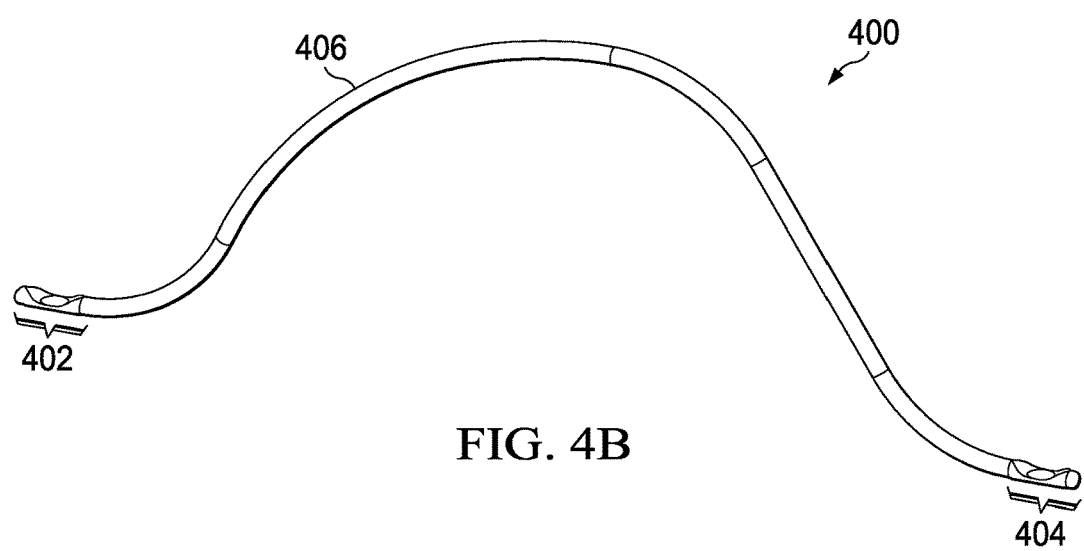
FIG. 4B is a perspective view of a wirebonded member having a wedge bond, in accordance with various examples.

FIG. 4B is a perspective view of the wirebonded member 400.

Figure 5A:
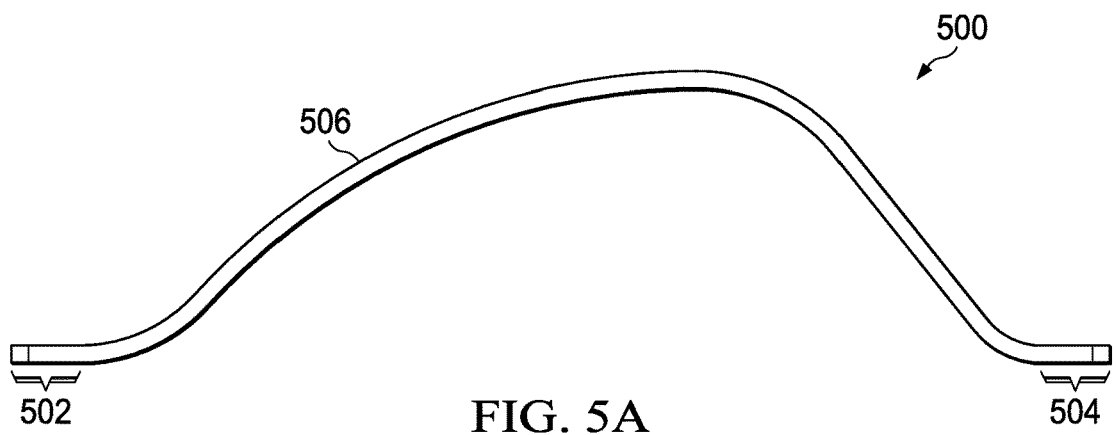
FIG. 5A is a profile view of a wirebonded member having a ribbon bond, in accordance with various examples.

FIG. 5A is a profile view of a wirebonded member 500 having a ribbon bond, in accordance with various examples. The wirebonded member 500 may be similar to the wirebonded members 118 described above. In some examples, the wirebonded member 500 is composed of copper. In other examples, the wirebonded member 500 is composed of aluminum. In some examples, the wirebonded member 500 is composed of the same material (e.g., metal or metal alloy) as the conductive member (e.g., conductive member 110) to which it is coupled. As a result, the wirebonded member 500 is more firmly coupled to the conductive member relative to other solutions, and thermal resistance is also reduced relative to other solutions. As described above with reference to the wirebonded members 118, the wirebonded member 500 has a thickness of at least 300 microns and a width of 1 mm. A thickness less than 300 microns does not adequately mitigate the risk of damage to the wirebonded member 500 as a result of physical impact with other objects. However, a thickness less than 300 microns may be used in the configuration of FIGS. 3A-3C, which includes a protective cavity 312. The wirebonded member 500 includes ribbon bonds 502 and 504. The surface to which the ribbon bonds 502 and 504 are coupled, such as the conductive member 110 of FIG. 1A, is not shown in FIG. 5A. In examples, a segment 506 that is between the opposing ends of the wirebonded member 500 at which the ribbon bonds 502 and 504 are positioned is raised as shown, so the segment 506 does not contact the surface to which the ribbon bonds 502 and 504 are coupled.

Figure 5B:
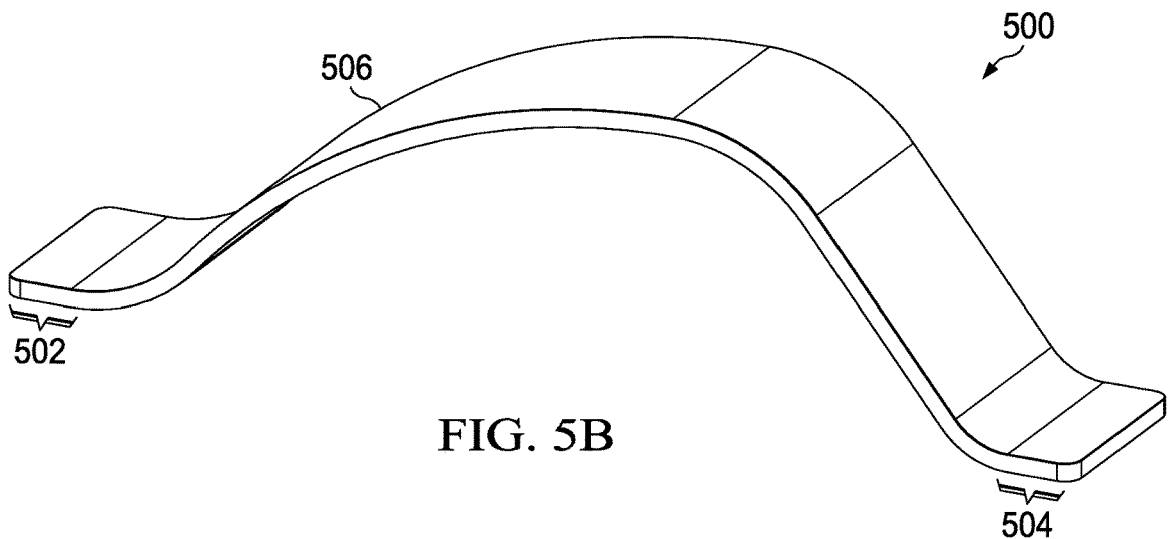
FIG. 5B is a perspective view of a wirebonded member having a ribbon bond, in accordance with various examples.

FIG. 5B is a perspective view of the wirebonded member 500.

Figure 6A:
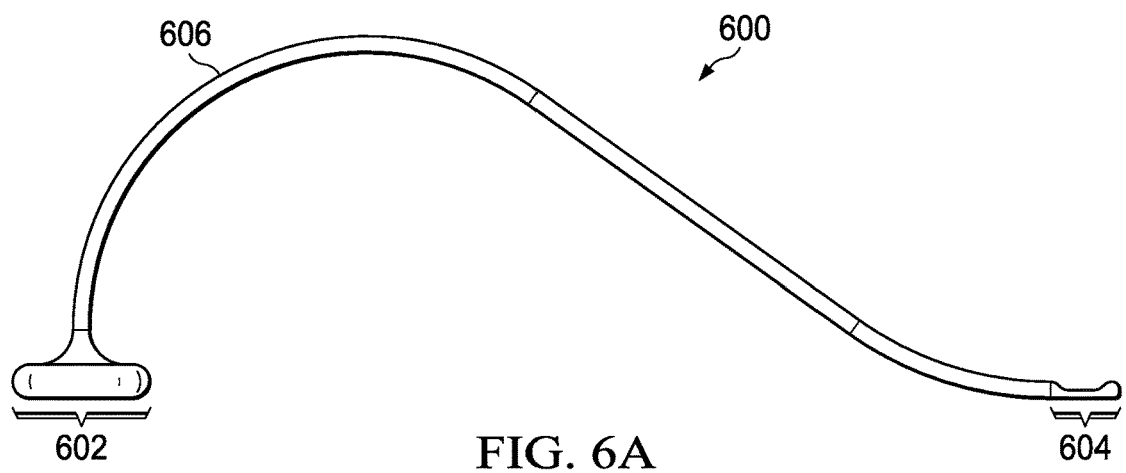
FIG. 6A is a profile view of a wirebonded member having a ball bond, in accordance with various examples.

FIG. 6A is a profile view of a wirebonded member 600 having a ball bond, in accordance with various examples. The wirebonded member 600 may be similar to the wirebonded members 118 described above. In some examples, the wirebonded member 600 is composed of copper. In other examples, the wirebonded member 600 is composed of aluminum. In some examples, the wirebonded member 600 is composed of the same material (e.g., metal or metal alloy) as the conductive member (e.g., conductive member 110) to which it is coupled. As a result, the wirebonded member 600 is more firmly coupled to the conductive member relative to other solutions, and thermal resistance is also reduced relative to other solutions. The wirebonded member 600 may have a gauge of less than 5 mils, and in such examples, the wirebonded member 600 may be positioned in a cavity, such as cavity 312 shown in FIGS. 3A-3C. The wirebonded member 600 includes a ball bond 602 and a wedge bond 604. The surface to which the bonds 602 and 604 are coupled, such as the conductive member 110 of FIG. 1A, is not shown in FIG. 6A. In examples, a segment 606 that is between the opposing ends of the wirebonded member 600 at which the bonds 602 and 604 are positioned is raised as shown, so the segment 606 does not contact the surface to which the bonds 602 and 604 are coupled.

Figure 6B:
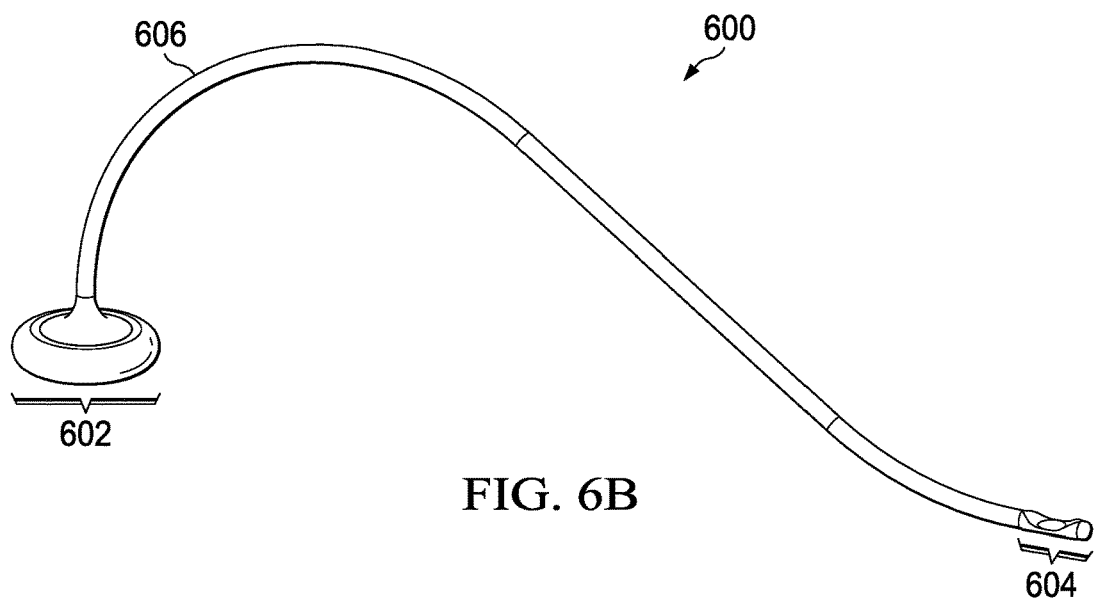
FIG. 6B is a perspective view of a wirebonded member having a ball bond, in accordance with various examples.

FIG. 6B is a perspective view of the wirebonded member 600.

FIG. 7A is a flow diagram of a method 700 for forming a semiconductor package having heat-dissipating wirebonded members, in accordance with various examples. FIGS. 7B1-7B4 are a process flow for forming a semiconductor package having heat-dissipating wirebonded members, in accordance with various examples. Accordingly, FIGS. 7A and 7B1-7B4 are now described in parallel. The method 700 begins with coupling a non-device side of a semiconductor die to a first surface of a conductive member using a die attach layer (702). FIG. 7B1 depicts the non-device side 106 of semiconductor die 102 being coupled to the conductive member 110 using a die attach layer 108. The method 700 includes coupling a device side of the semiconductor die to a conductive member (704). FIG. 7B2 shows wirebonds 112 coupling the device side 104 of the semiconductor die 102 to conductive members 114. The method 700 includes covering the semiconductor die and at least a portion of the conductive member with a mold compound, where the conductive member is exposed to a top surface of the mold compound (706). FIG. 7B3 shows the semiconductor package 100, which includes the structure of FIG. 7B2 and the mold compound 116 covering the structure of FIG. 7B2. The method 700 includes coupling a set of wirebonded members to a second surface of the conductive member, where the second surface of the conductive member opposes the first surface of the conductive member, and where at least one of the wirebonded members has a gauge of at least 5 mils (708). FIG. 7B4 shows the structure of FIG. 7B3, but with the addition of wirebonded members 118 coupled to the conductive member 110, as shown.

FIG. 8A is a flow diagram of a method 800 for forming a semiconductor package having heat-dissipating wirebonded members in a cavity, in accordance with various examples. FIGS. 8B1-8B5 are a process flow for forming a semiconductor package having heat-dissipating wirebonded members in a cavity, in accordance with various examples. Accordingly, FIGS. 8A and 8B1-8B5 are described in parallel. The method 800 begins with coupling a non-device side of a semiconductor die to a first surface of a conductive member using a die attach layer (802). FIG. 8B1 shows the non-device side 106 of the semiconductor die 102 being coupled to the conductive member 110 using die attach layer 108. The method 800 includes coupling a device side of the semiconductor die to a conductive member (804). FIG. 8B2 shows the structure of FIG. 8B1, but with wirebonds 112 coupling the device side 104 of the semiconductor die 102 to the conductive members 114. The method 800 includes using a mold chase having a top member with a protrusion to inject a mold compound covering the semiconductor die and at least a portion of the conductive member, where the conductive member is exposed to an exterior of the semiconductor package (806). FIG. 8B3 shows a mold chase top member 850 having a protrusion 852 that is lowered onto the conductive member 110 such that the protrusion 852 precludes mold compound from being deposited on top of the conductive member 110. Mold compound is then injected, forming the semiconductor package 100 of FIG. 8B4. The method 800 includes coupling a set of wirebonded members to a second surface of the conductive member, where the second surface of the conductive member opposes the first surface of the conductive member, and where the set of wirebonded members are in a cavity defined by the mold compound (808). FIG. 8B5 shows the structure of FIG. 8B4, but with the addition of the wirebonded members 118 positioned in the cavity 312 and on the conductive member 110, as shown.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means+/−10 percent of the stated value. Modifications are possible in the described examples, and other examples are possible within the scope of the claims.

What is claimed is:

1. A semiconductor package, comprising:
   a semiconductor die having a device side and a non-device side opposing the device side, the device side having a circuit formed therein;
   a first conductive member having a first surface coupled to the non-device side of the semiconductor die and a second surface opposing the first surface, the second surface exposed from a top surface of the semiconductor package;
   a lead of the semiconductor package electrically coupled to the device side of the semiconductor die; and
   a plurality of wirebonded members coupled to the second surface of the first conductive member and projecting from the top surface of the semiconductor package, at least one of the wirebonded members in the plurality of wirebonded members having a gauge of at least 5 mils.

2. The semiconductor package of claim 1, wherein at least one of the wirebonded members in the plurality of wirebonded members is wedge-bonded to the second surface of the first conductive member.

3. The semiconductor package of claim 1, wherein at least one of the wirebonded members in the plurality of wirebonded members is ribbon-bonded to the second surface of the first conductive member.

4. The semiconductor package of claim 1, wherein at least one of the wirebonded members in the plurality of wirebonded members has first and second ends that are bonded to the second surface of the first conductive member and a segment between the first and second ends that is raised above the second surface so as not to contact the second surface.

5. The semiconductor package of claim 1, wherein the lead is a gullwing-style lead.

6. The semiconductor package of claim 1, wherein at least one of the wirebonded members in the plurality of wirebonded members is composed of a metal, and wherein the second surface of the first conductive member is also composed of the metal.

7. The semiconductor package of claim 6, wherein the metal is copper.

8. A semiconductor package, comprising:
a semiconductor die having a device side and a non-device side opposing the device side, the device side having a circuit formed therein, the non-device side facing a top surface of the semiconductor package;
a conductive member electrically coupled to the device side of the semiconductor die; and
a plurality of wirebonded members positioned in vertical alignment with the semiconductor die and projecting from the top surface of the semiconductor package, at least one of the wirebonded members having opposing ends coupled to the top surface of the semiconductor package and a segment between the opposing ends that is raised above the top surface of the semiconductor package.

9. The semiconductor package of claim 8, wherein the opposing ends of the at least one of the wirebonded members is wedge-bonded to the top surface of the semiconductor package.

10. The semiconductor package of claim 8, wherein the opposing ends of the at least one of the wirebonded members is ribbon-bonded to the top surface of the semiconductor package.

11. The semiconductor package of claim 8, wherein the opposing ends of the at least one of the wirebonded members is ball-bonded to the top surface of the semiconductor package.

12. The semiconductor package of claim 8, wherein the at least one of the wirebonded members has a gauge of at least 5 mils.

13. The semiconductor package of claim 8, further comprising a die pad coupled to the non-device side of the semiconductor die, and wherein the die pad is exposed to the top surface of the semiconductor package, and wherein the plurality of wirebonded members are coupled to the die pad.

14. The semiconductor package of claim 13, wherein the at least one of the wirebonded members is composed of a metal, and wherein the die pad is composed of the metal.

15. The semiconductor package of claim 8, further comprising a mold compound layer covering the semiconductor die and defining a cavity, wherein the plurality of wirebonded members are positioned inside the cavity.

* * * * *